US010673432B1

(12) United States Patent
Kaya

(10) Patent No.: US 10,673,432 B1
(45) Date of Patent: Jun. 2, 2020

(54) DELAYING TURN ON TIME TO TRANSISTOR COMPARING GLOBAL, PEAK CURRENT

(71) Applicant: Texas Instruments Incorporated, Dallas, TX (US)

(72) Inventor: Cetin Kaya, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/219,345

(22) Filed: Dec. 13, 2018

(51) Int. Cl.
| | |
|---|---|
| *H02M 3/158* | (2006.01) |
| *H03K 17/687* | (2006.01) |
| *G01R 19/165* | (2006.01) |
| *H03K 17/284* | (2006.01) |
| *H03K 17/14* | (2006.01) |

(52) U.S. Cl.
CPC ... *H03K 17/6871* (2013.01); *G01R 19/16528* (2013.01); *H02M 3/158* (2013.01); *H03K 17/145* (2013.01); *H03K 17/284* (2013.01)

(58) Field of Classification Search
None
See application file for complete search history.

(56) References Cited

U.S. PATENT DOCUMENTS

| | | | | |
|---|---|---|---|---|
| 7,915,873 | B2 * | 3/2011 | Yen | H02M 3/156 323/224 |
| 9,705,395 | B2 * | 7/2017 | Tomas | H02M 1/32 |
| 2003/0161167 | A1 * | 8/2003 | Barnett | H02M 1/4225 363/72 |
| 2005/0248360 | A1 * | 11/2005 | Patel | G01R 31/40 324/762.09 |
| 2006/0061339 | A1 | 3/2006 | Lewis | |
| 2008/0211313 | A1 * | 9/2008 | Nakamura | G05F 1/56 307/75 |
| 2009/0174485 | A1 * | 7/2009 | Teng | H03F 1/523 330/298 |
| 2011/0210713 | A1 * | 9/2011 | Kazama | H02M 3/1588 323/311 |

(Continued)

FOREIGN PATENT DOCUMENTS

EP     1432107 A2 *  6/2004  ............ H02M 7/537

OTHER PUBLICATIONS

U.S. Appl. No. 15/960,537, "Paralleling Multiple Power Switches," filed Apr. 23, 2018, 44 pages.

*Primary Examiner* — Jeffrey A Gblende
(74) *Attorney, Agent, or Firm* — Mark Allen Valetti; Charles A. Brill; Frank D. Cimino

(57) ABSTRACT

Methods, apparatus, systems and articles of manufacture are disclosed to control parallel transistors. An example system includes a first transistor coupled in parallel to a second transistor, a pulse width modulation generator coupled to the first transistor. The pulse width modulation generator is to generate a first signal. The example system further includes a first switch timing controller coupled to the pulse width modulation generator. The first switch timing controller is to compare a first peak current of the first transistor with a second peak current and generate a second signal based on the comparison of the first peak current and the second peak current. The example system further includes a gate driver coupled to the first switch timing controller and the gate driver is to control the first transistor in response to the second signal.

16 Claims, 8 Drawing Sheets

(56) References Cited

U.S. PATENT DOCUMENTS

2017/0040894 A1\*  2/2017  MeVay ................ H03K 5/1532
2017/0359059 A1\* 12/2017  Bazzani ............... H03K 17/165
2018/0262193 A1\*  9/2018  Pidutti ............... H03K 17/6872

\* cited by examiner

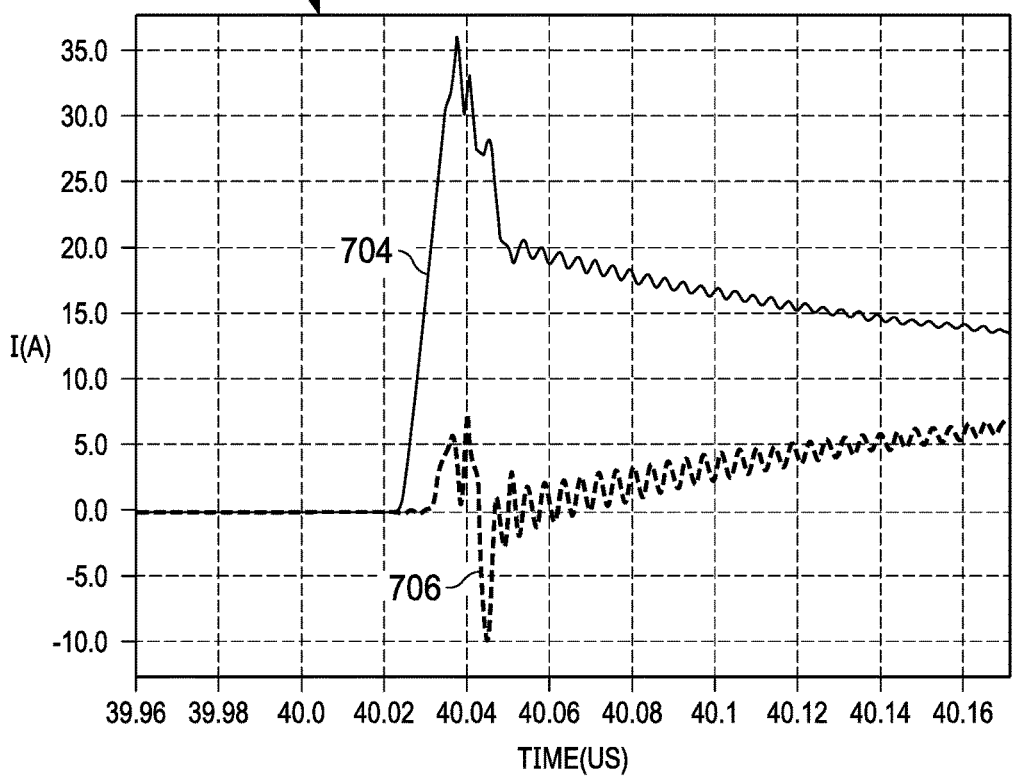
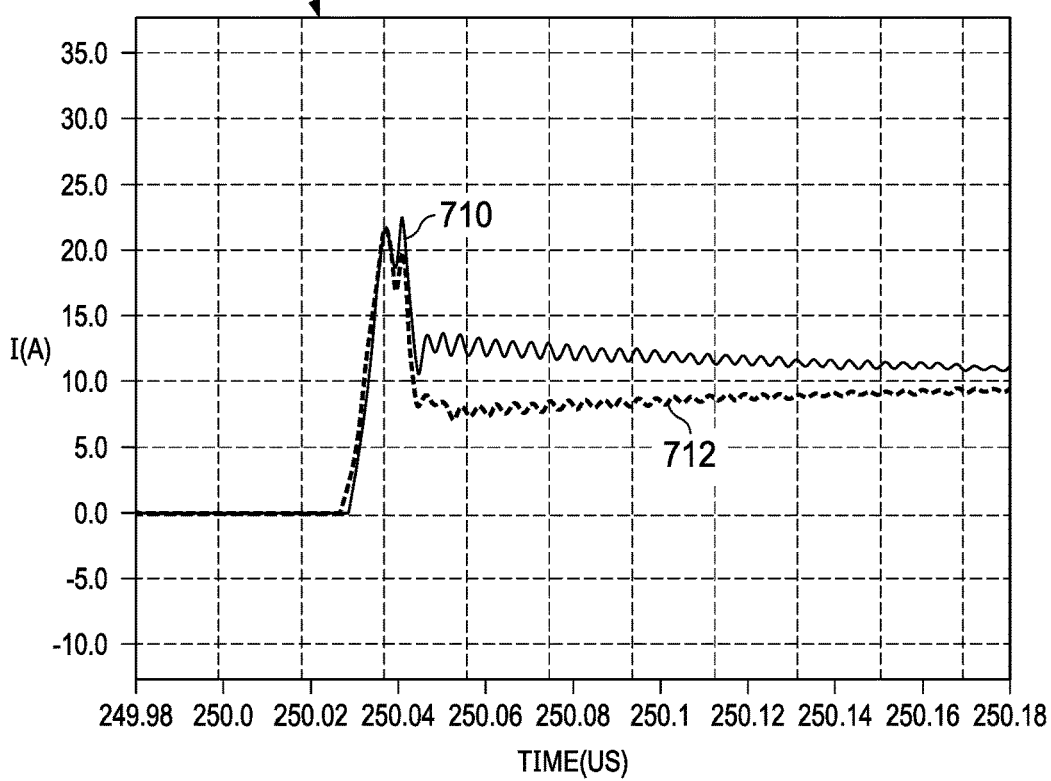

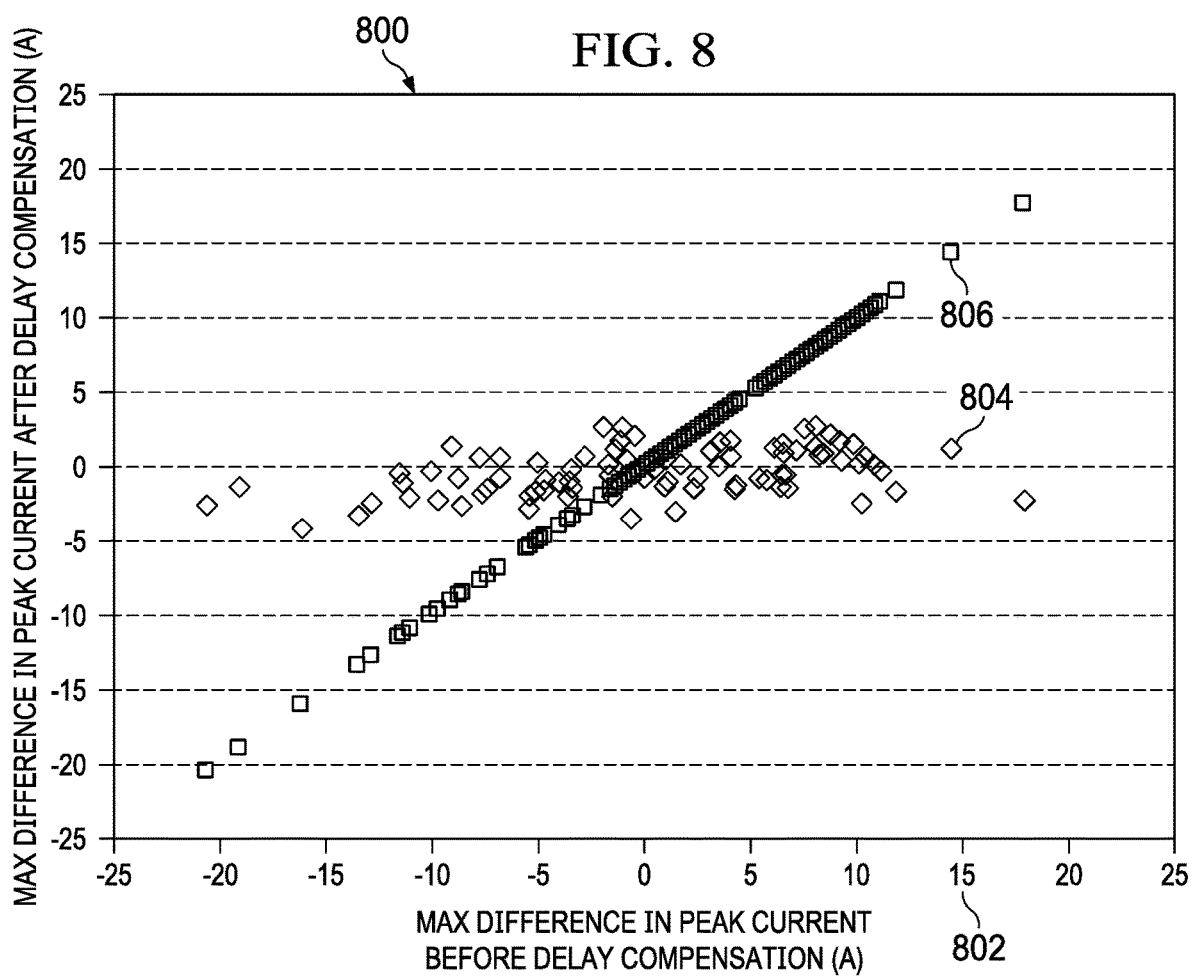

US 10,673,432 B1

DELAYING TURN ON TIME TO TRANSISTOR COMPARING GLOBAL, PEAK CURRENT

FIELD OF THE DISCLOSURE

This disclosure relates generally to power devices, and, more particularly, to methods and apparatus to control parallel power devices.

BACKGROUND

In certain applications, a transistor, such as a field-effect transistor (FET) or metal-oxide-semiconductor field-effect transistor (MOSFET), is connected in parallel with another transistor. The parallel-coupled transistors may be controlled to provide current to a load by pulse width modulation (PWM) signals provided to gates of the transistors.

SUMMARY

An example system includes a first transistor coupled in parallel to a second transistor, a pulse width modulation generator coupled to the first transistor. The pulse width modulation generator is to generate a first signal. The example system further includes a first switch timing controller coupled to the pulse width modulation generator. The first switch timing controller is to compare a first peak current of the first transistor with a second peak current and generate a second signal based on the comparison of the first peak current and the second peak current. The example system further includes a gate driver coupled to the first switch timing controller and the gate driver is to control the first transistor in response to the second signal.

BRIEF DESCRIPTION OF THE DRAWINGS

FIG. 7A is a graphical illustration of example initial peak currents through the parallel-coupled transistors of FIGS. 1-2, and 5 versus time without the use of a switch timing controller, as described herein.

FIG. 7B is a graphical illustration of example initial peak currents through the parallel-coupled transistors of FIGS. 1-2, and 5 versus time with the use of the example switch timing controller, as described herein.

FIG. 8 is a graphical illustration of varying data sets illustrating example initial peak currents through the parallel-coupled transistors of FIGS. 1-2, and 5, with and without the use of the example switch timing controller, as described herein.

Figure 1:
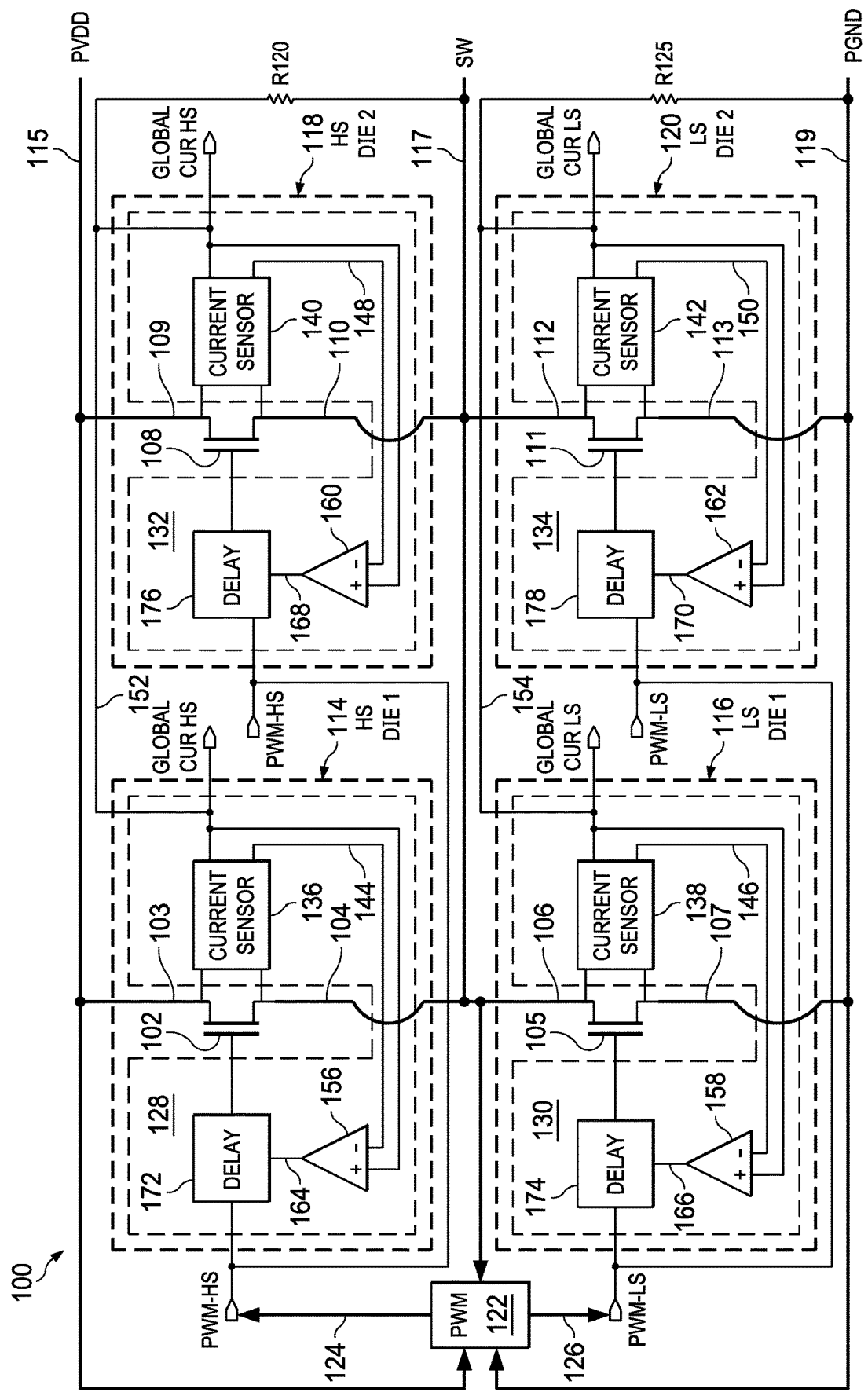
FIG. 1 is a schematic of an example circuit including transistors in which the peak current passed by the transistors is controlled.

The figures are not to scale. In general, the same reference numbers will be used throughout the drawing(s) and accompanying written description to refer to the same or like parts. Although the figures show circuits and blocks with clean lines and boundaries, some or all of these lines and/or boundaries may be idealized. In reality, the boundaries and/or lines may be unobservable, blended, and/or irregular.

DETAILED DESCRIPTION

Power stages are utilized in, for example, power conversion circuits, power factor correction circuits, discontinuous current mode power switching circuits, continuous current mode power switching circuits, adapters, or electric vehicle charging units. A technique to provide power and/or current in a power stage is to parallel-couple transistors. When parallel-coupled, transistors are connected to a common voltage source and load and are driven by a PWM gate driver signal (e.g., PWM Signal). Parallel-coupling transistors that receive the same PWM signal increases the ability of a power stage to source output current because the parallel-coupled transistors share the current load.

In some applications, parallel-coupled transistors that receive the same PWM signal turn on and/or off at precisely the same time. When parallel-coupled transistors turn on at exactly the same time, the load current is split equally across the parallel-coupled transistors and the in-rush current is shared. However, in practice, even though the parallel-coupled transistors may be driven by the same PWM signal, each transistor may turn on at a slightly different time. When parallel-coupled transistors are utilized, the first transistor of the parallel-coupled transistors to turn on in response to a PWM signal will experience a higher in-rush current than the other transistors. For example, the transistor that turns on first will, for a short period of time, conduct the total load current instead of splitting the load current across the other parallel-coupled transistor. A single parallel-coupled transistor that conducts the total load current encounters high safe operating area (SOA) stress and, thus, the transistor operates in conditions that stress the transistor and lead to faster degradation.

Previous techniques to avoid subjecting one transistor of a parallel arrangement to increased SOA stress included attempting to synchronize parallel-coupled transistors based on device temperature. For example, if a first transistor coupled in parallel with a second transistor were to turn on first, even for a small period of time (e.g., 1 microsecond), the first transistor will exhibit a higher temperature than the second transistor. Accordingly, in previous techniques, a delay would be generated in response to the higher transistor temperature, and thus, the signals used to turn on the first transistor were adjusted so that the turn on time of the first transistor more closely matched the turn on time of the second transistor.

Examples disclosed herein include controlling parallel-coupled transistors based on initial peak current. Examples disclosed herein include transistors produced using Gallium Nitride (GaN). Additionally, examples disclosed herein include parallel-coupled GaN transistors and include methods and apparatus to control parallel-coupled transistors based on initial peak current conducting through the parallel-coupled transistors (e.g., from the transistor drain to the transistor source). Examples disclosed herein include sensing the initial peak current of individual ones of parallel-coupled transistors. The transistors utilized in examples disclosed herein may be power transistors. Alternatively, in some examples disclosed herein, the transistors utilized may be produced using Silicon (Si) or any suitable semiconductor substrate.

In examples disclosed herein, the turn-on time of the transistor that experience a higher initial peak current than the other parallel-coupled transistors (e.g., the transistor that turns on first in response to a PWM signal) can be adjusted (e.g., by delaying the PWM signal) to match the turn-on time of the other parallel-coupled transistors. The turn-on time of the transistor that turns on first can be adjusted to reduce the initial peak current conducting through the transistor. Additionally, the turn-on time of the transistor that turns on first can be adjusted until the initial peak current conducting through the transistor satisfies a threshold. In some examples, the threshold may be an average initial peak current (e.g., normal average initial peak current of all parallel-coupled transistors), a pre-determined initial peak current, or any other initial peak current value. In other examples disclosed herein, if more than two transistors are parallel-coupled, the turn-on times of at least two of the parallel-coupled transistors can be adjusted to match the turn-on time(s) of one or more of the other parallel-coupled transistor(s).

Additionally, examples disclosed herein include methods and apparatus to control parallel-coupled transistors based on initial peak current conducting through the parallel-coupled transistors (e.g., from the transistor drain to the transistor source), transistor temperature, or any other transistor parameter.

FIG. 1 is a schematic of an example circuit 100 including transistors 102, 105, 108, and 111 in which the peak current passed by the transistors 102, 105, 108, and 111 is controlled. The transistors 102, 105, 108, and 111 each include two current terminals (103 and 104, 106 and 107, 109 and 110, 112 and 113) respectively. The transistors 102, 105, 108, and 111, may be formed on respective dies 114, 116, 118 and 120. The dies 114, 116, 118 and 120 can be thermally coupled to at least one heatsink.

In the example illustrated in FIG. 1, a pulse width modulation generator 122 (PWM generator 122) generates PWM signals 124 and 126 (e.g., PWM-HS and PWM-LS) for the parallel-coupled high-side transistors 102, 108 and the parallel-coupled low-side transistors 105, 111 respectively. The example switch timing controller 128 is coupled to the PWM generator 122 and the high-side transistor 102, and the example switch timing controller 132 is coupled to the PWM generator 122 and the high-side transistor 108. Likewise, the example switch timing controller 130 is coupled to the PWM generator 122 and the low-side transistor 105, and the example switch timing controller 134 is coupled to the PWM generator 122 and the low-side transistor 111. In the example of FIG. 1, the PWM generator 122 generates PWM signals 124 and 126 (e.g., PWM-HS and PWM-LS); however, the PWM generator 122 is not limited to generating the two PWM signals 124 and 126 (e.g., PWM-HS and PWM-LS). For example, four PWM signals can be generated for the four transistors (102, 105, 108, and 111), and therefore, a delay can be implemented for each transistor individually by the PWM generator 122.

The transistors 102 and 108 form a pair of high-side transistors that are coupled in parallel. The transistors 105 and 111 form a pair of low-side transistors that are also coupled in parallel. The high-side transistors 102 and 108 are coupled between an example positive voltage bus PVDD 115 and the example switched circuit node SW 117, and the example low-side transistors 105 and 111 are coupled between the switched circuit node SW 117 and example local circuit ground PGND 119. The high-side and low-side transistors (102, 105, 108, and 111) may include Gallium Nitride (GaN) layers formed epitaxially on a silicon substrate. Electrons in a GaN channel (e.g., 2DEG channel) move more quickly than electrons in a silicon (Si) channel (e.g., inversion channel), and thus, a GaN transistor (e.g., high electron mobility transistor (HEMT)) turns on and/or off faster than a Si transistor in response to a PWM signal. Additionally, transistors produced with a GaN layer include a lower capacitance between the drain and source terminals than transistors produced with Si. As a result, when a GaN transistor (e.g., high electron mobility transistor (HEMT)) is subjected to hard switching, the time in which the amplitude of the drain to source voltage is high and the amplitude of the drain current is high (e.g., the amplitude of the drain to source voltage overlaps with the amplitude of the drain current) is reduced. The reduction of time in which the amplitude of the drain to source voltage is high and the amplitude of the drain current is high allows the GaN transistor (e.g., high electron mobility transistor (HEMT)) to operate safely during hard switching. In some examples disclosed herein, the transistors 102, 105, 108, and 111 may be produced using a Si substrate, or any other transistor substrate.

In examples disclosed herein, the current terminals 103 and 104 (e.g., source and drain terminals) of the high-side transistor 102 can each be coupled (e.g., connected) to the respective current terminals 109 and 110 of the high-side transistor 108 without intervening passive components (e.g., inductors, capacitors) coupled therebetween. The current terminals 103, 104, 109, and 110 of the example high-side transistors 102 and 108, respectively, are coupled in parallel such that larger amounts of power and/or current are switchable than otherwise possible when switched by only one example high-side transistor.

Likewise, in some examples disclosed herein, the current terminals 106 and 107 (e.g., source and drain terminals) of the low-side transistor 105 can each be coupled (e.g., connected) to the respective current terminals 112 and 113 of the low-side transistor 111 without intervening passive components (e.g., inductors, capacitors) coupled therebetween. The current terminals 106, 107, 112, 113 of the example low-side transistors 105 and 111, respectively, are coupled in parallel such that larger amounts of power and/or current are switchable than otherwise possible when switched by only one example low-side transistor.

Although the example high-side and low-side transistors (102, 105, 108 and 111) are respectively coupled as pairs, each of the example high-side and low-side transistors (102, 105, 108 and 111) may be individually controlled in response to a peak current associated with an individual transistor. For example, if the high-side transistor 102 conducts a greater initial peak current than the high-side transistor 108, the high-side transistor 102 can be switched in response to the local initial peak current of the high-side transistor 108. Likewise, if the low-side transistor 105 conducts a greater initial peak current than the low-side transistor 111, the low-side transistor 105 can be switched in response to the local peak current of the low-side transistor 111.

An example PWM generator 122 is arranged to generate the example pulse width modulated high-side signal 124 for controlling the example high-side transistors 102 and 108 in response to the example circuit node SW 117. The example PWM generator 122 can alternatively be arranged to control the example high-side transistors 102 and 108 (and/or the low-side transistors 105 and 111) in response to a system operating parameter, such as an output voltage of a resistive, inductive, or capacitive load powered by the circuit 100. The example PWM generator 122 is arranged generate the example pulse width modulated low-side signal 126 for controlling the example low-side transistors 105 and 111 in response to the example circuit node SW 117. The example PWM generator 122 can be powered by the example power rails PVDD 115 and PGND 119. In various examples, the PWM generator 122 can be a processor, such as a microcontroller or a digital signal processor (DSP).

An example pulse-width modulated high-side signal 124 (e.g., PWM-HS) is coupled to a first switch timing controller 128 and a second switch timing controller 132. The example pulse-width modulated low-side signal 126 (e.g., PWM-LS) is coupled to a third switch timing controller 130 and a fourth switch timing controller 134. In some examples disclosed herein, the PWM generator 122

The example switch timing controllers (e.g., one of 128, 130, 132, and 134) each includes a current sensor (e.g., 136, 138, 140, and 142, respectively), an operational amplifier (e.g., 156, 158, 160, and 162, respectively), and a power switching delay circuit (e.g., 172, 174, 176, and 178, respectively). The switch timing controllers (e.g., one of 128, 130, 132, and 134) can be included on the same die (e.g., 114, 116, 118, and 120, respectively) of the high-side or low-side transistor being controlled (e.g., 102, 105, 108, and 111, respectively). Alternatively, the switch timing controllers (e.g., one of 128, 130, 132, and 134) can be included on a separate die (e.g., 114, 116, 118, and 120, respectively) of the high-side or low-side transistor being controlled (e.g., 102, 105, 108, and 111, respectively).

Example current sensors 136, 138, 140, and 142 are coupled respectively to the example high-side and low-side transistors (102, 105, 108 and 111). The example current sensors 136, 138, 140, and 142 can be arranged on a multi-chip module adjacent to a component (e.g., chip including a high-side or low-side transistor to be monitored) mounted on the multi-chip module. The example current sensors can be located virtually anywhere on a die or a multi-chip module where the current sensors are coupled to an example respective metal-oxide-semiconductor field-effect-transistor.

In one example, the current sensors 136, 138, 140, and 142 are arranged on the same die(s) upon which each respective high-side and low-side transistor (102, 105, 108, and 111) is arranged. In another example, the current sensors 136, 138, 140, and 142 may be arranged on a multi-chip module upon which each respective high-side and low-side transistors (102, 105, 108, and 111) are carried. The example current sensors 136, 138, 140, and 142 are coupled to respective example high-side and low-side transistors (102, 105, 108 and 111). For example, the current sensors 136, 138, 140, and 142 may be coupled to the respective high-side and low-side transistors (102, 105, 108, and 111) by being arranged on the same die (e.g., 114, 116, 118, 120).

The example current sensors 136, 138, 140, and 142 are arranged (e.g., placed) to generate respective local sensed transistor peak currents 144, 146, 148, and 150, such that each signal indicates a sensed transistor peak current for a respective example high-side and low-side transistor (102, 105, 108, 111). Additionally, each signal which indicates a sensed transistor peak current 144, 146, 148, 150 may also be a voltage signal. The sensed transistor peak current 144, 146, 148, 150 are coupled to inverting input terminals of an example operational amplifier 156, 158, 160, 162. An example global peak current signal 152, 154 is generated for each of the high-side and low-side circuits respectively, such that a global current signal 152, 154 is generated in response to current indications of at least two transistors of each of the high and low sides. In some examples disclosed herein, each respective global current signal 152, 154 is a signal representative of a respective average peak current (e.g., the global current high-side 152 represents an average peak current of the sensed transistor peak currents 144 and 148).

Each respective global current signal 152, 154 is coupled to a non-inverting input terminal of an example operational amplifier 156, 158, 160, 162. For example, a global current high-side (GLOBAL CUR HS) signal 152 is coupled to operational amplifiers 156 and 160, and a global current low-side (GLOBAL CUR LS) signal 154 is coupled to operational amplifiers 158 and 162. Additionally, each signal which indicates a global current signal (152 or 154) may also be a voltage signal. Alternatively, the example global current signal (152 or 154) may be coupled to an inverting input terminal of an operational amplifier 156, 158, 160, 162. Likewise, the example local current signal (144, 146, 148, and 150) may be coupled to a non-inverting input terminal of an operational amplifier 156, 158, 160, and 162, respectively. Additionally, the respective global current signals 152, 154 may be coupled to a resistor (R120, R125).

Each of the example operational amplifiers 156, 158, 160, and 162 are arranged to generate a respective local current delta reference signal 164, 166, 168, and 170 in response to the respective global current signal 152 and 154 and the local current signal 144, 146, 148, and 150. Each respective local current delta reference signal 164, 166, 168, and 170 is coupled to a respective input terminal of the power switching delay circuits 172, 174, 176, and 178.

The example power switching delay circuits 172, 174, 176, and 178 may be analog circuits in which each example power switching delay circuit is configured to delay a respective pulse-width modulated signal (124 or 126) in response to a respective local current delta reference signal 164, 166, 168, and 170.

The first power switching delay circuit 172 and the second power switching delay circuit 176 generate respective delayed PWM signals that are coupled to respective gate (e.g., control) terminals of the high-side transistors 102 and 108. A pulse-width modulated low-side (PWM-LS) signal 126 is coupled to a third power switching delay circuit 174 and a fourth power switching delay circuit 178. The third power switching delay circuit 174 and the fourth power switching delay circuit 178 generate respective delayed PWM signals that are coupled to respective gate terminals of the low-side transistors 105 and 111.

The example high-side transistors 102 and 108 are activated (e.g., by establishing a conduction channel) in response to the assertion of the example pulse-width modulated high-side signal 124. At least one of the example transistors 102 and 108 is also activated in response to a respective example power switching delay circuit 172, 176. The example low-side transistors 105 and 111 are activated in a similar manner, albeit in response to the low-side pulse-width modulated low-side signal 126 and arrangements.

Figure 2:
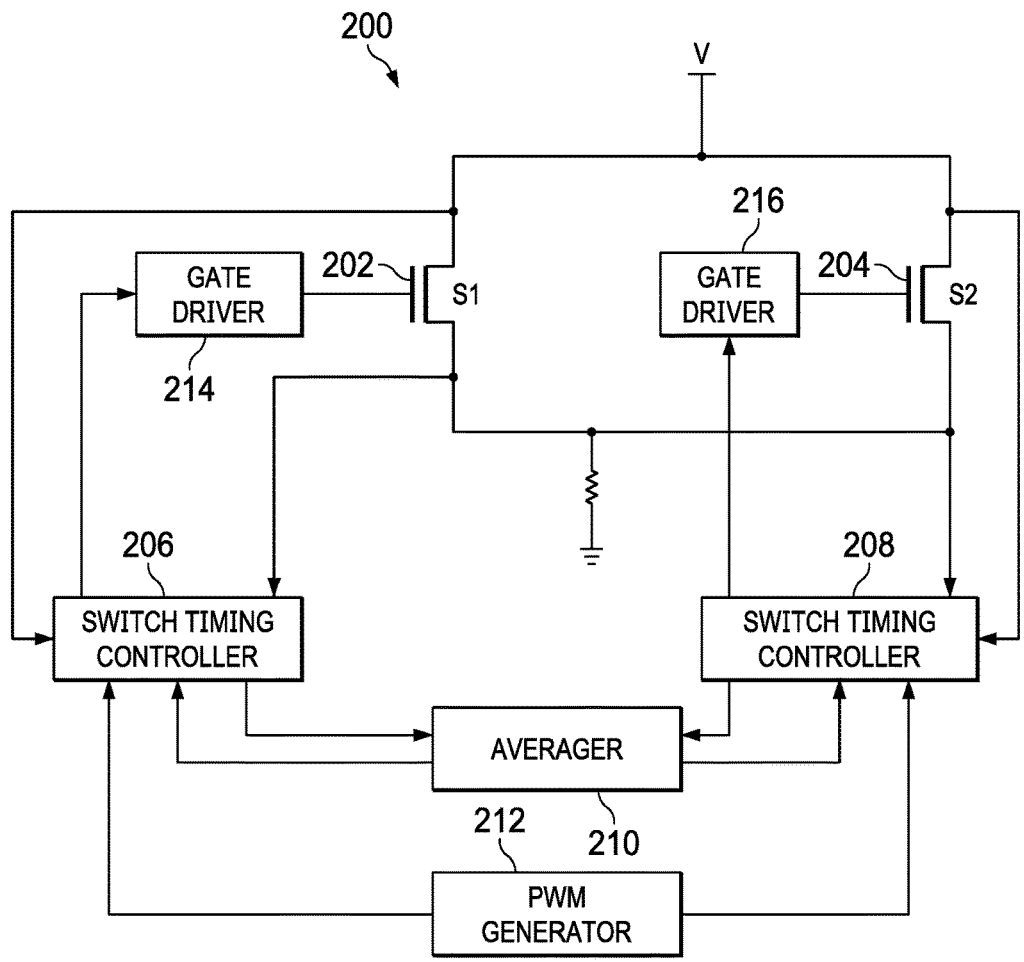
FIG. 2 is a schematic of an example circuit including additional detail of two parallel-coupled transistors and example switch timing controllers of FIG. 1.

FIG. 2 is a schematic 200 of an example circuit including additional detail of two parallel-coupled transistors and example switch timing controllers of FIG. 1. Example transistors 202, 204 are coupled in parallel, both receiving the same input voltage on either the drain terminal or source terminal. The transistor 202 is coupled to a switch timing controller 206. Likewise, the transistor 204 is coupled to a switch timing controller 208. An averager 210 is coupled to both switch timing controllers 206 and 208. Likewise, the PWM generator 212 is coupled to both switch timing controllers 206, 208. The switch timing controllers 206, 208 are coupled to the gate drivers 214, 216. The gate drivers 214 and 216 receive and/or distribute equivalent pulse width modulated signals to turn on and/or off transistors 202, 204.

The transistors 202, 204 may be high electron mobility transistors (HEMT's) and may be implemented in a discrete manner, as a semiconductor substrate or may be implemented utilizing any other method. The HEMT's are three-terminal devices with a drain terminal, source terminal, and gate terminal.

The transistors 202, 204 may be formed on a substrate, such as a printed circuit board or an integrated circuit, in which the substrate is formed out of a semiconductor material (e.g., silicon or gallium nitride). Example implementations include a gallium nitride (GaN) power stage.

The example switch timing controllers 206, 208 are coupled to the PWM generator 212. The switch timing controller 206 receives and/or distributes a PWM signal to the gate driver 214. Likewise, the switch timing controller 208 receives and/or distributes a separate PWM signal to the gate driver 216. In this manner, the PWM signals sent by the switch timing controllers 206, 208 are adjusted to synchronize the turn on times of the transistors 202, 204 individually (e.g., turn on and/or off at the same time). The switch timing controller 206 is coupled to the transistor 202. The switch timing controller 206 senses the peak current through transistor 202. Likewise, the switch timing controller 208 is coupled to the transistor 204, and the switch timing controller 208 senses the peak current through the transistor 204. In other examples disclosed herein, the switch timing controllers 206, 208 may be implemented in a network of devices, in which the network includes a variable number of switch timing controllers 206, 208 or other electronic devices.

The example averager 210 is coupled to the switch timing controller 206 and the switch timing controller 208. The averager 210 receives the peak currents through the transistors 202, 204. The averager 210 may receive a metric from at least one current sensor and generate another metric representative of all metrics from all coupled the current sensors. For example, if there are two parallel-coupled transistors, the averager 210 receives a current metric (e.g., sensed peak currents 144, 146, 148, and/or 150 of FIG. 1) representative of each individual parallel-coupled transistor. The averager 210 generates an additional metric (e.g., an average, global current high-side and/or low side signal 152, 154 of FIG. 1) representative of all parallel-coupled transistors. In other examples disclosed herein, the averager 210 produces a metric which may not be a direct average. For example, the averager 210 may create a metric that is consistent with a standard average, weighted average, normalized average, mean, median, mode, etc. Other examples include a metric representative of at least two independent metrics (e.g., peak current metric from a first switch and peak current metric from a second switch). The example metric produced by the averager 210 is a representation of all currents flowing through at least one switch timing controller 206 or 208. The currents flowing through at least one switch timing controller 206, 208 are currents from at least one transistor 202 or 204. In some examples, the averager 210 includes several parallel-coupled resistances including at least one resistor internally or externally. Alternatively, the averager 210 may be implemented as a shunt resistor network. In doing so, the current flowing through the parallel-coupled resistance is averaged across the number of resistors in the network.

In other examples disclosed herein, the averager 210 may produce a metric which is a representation of a temperature and/or current value produced by at least one switch timing controller 206 or 208. Other implementations include an averager 210 in which the metric produced by the averager 210 is the initial peak current of a single transistor (e.g., the master transistor). In this case, the initial peak current of the master transistor will serve as a target peak current for all other parallel-coupled transistors to model. Another example includes a single transistor that is a master transistor (e.g., a transistor with an initial peak current as the standard initial peak current for all other parallel-coupled transistors). Alternatively, other examples may include a dynamic master transistor (e.g., the transistor that is the master transistor may change). In other implementations, the averager 210 may be implemented in a network of devices, in which the network may include a variable number of electronic devices.

The example PWM generator 212 is coupled to the switch timing controller 206 and the switch timing controller 208. A PWM signal is sent from the PWM generator 212 through the switch timing controller 206 to command the transistor 202 when to turn on and/or turn off. Likewise, a PWM signal is sent from the PWM generator 212 through the switch timing controller 208 to command the transistor 204 when to turn on and/or turn off. The signals sent to the switch timing controllers 206, 208 may vary in amplitude, duty cycle, frequency, etc.

The example gate drivers 214, 216 accept a low power input from the switch timing controllers 206, 208. In this example, the gate driver 214 produces a high-current drive input for the gate terminal of the transistor 202. Likewise, the gate driver 216 produces a high-current drive input for the gate terminal of transistor 204. Alternatively, the gate driver 214 and/or the gate driver 216 may produce a low-current drive input for the gate terminal of transistor 202 and/or transistor 204. The gate drivers 214, 216 may be implemented with discrete components, on a chip, integrated CMOS devices on a chip, or any other method of implementing a gate driver not directly disclosed herein.

Figure 3:
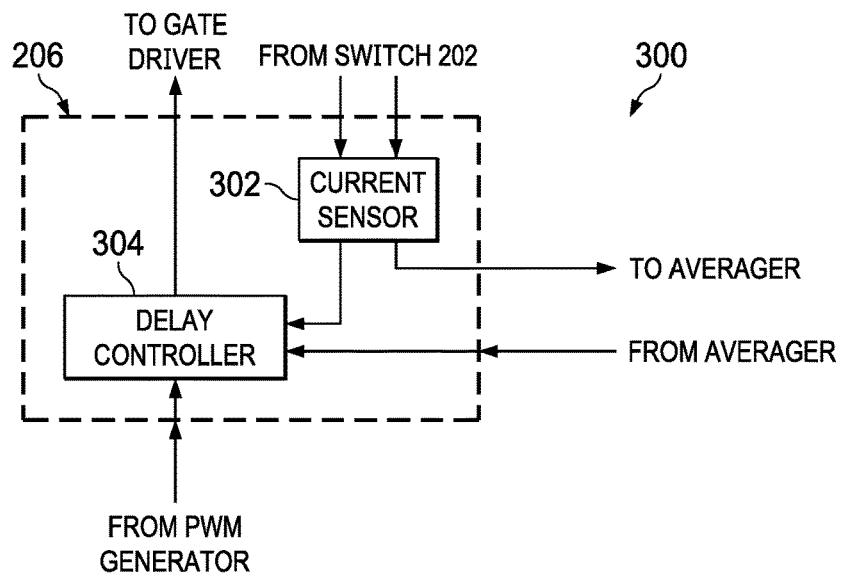
FIG. 3 is a block diagram illustrating additional detail of an example implementation of one of the switch timing controllers of FIG. 2.

FIG. 3 is a block diagram 300 illustrating additional detail of an example implementation of one of the switch timing controllers of FIG. 2. The example block diagram for the switch timing controller as shown in FIG. 3 may be used for the switch timing controller(s) 206 and/or 208. Additionally, a separate switch timing controller may be utilized for all parallel-coupled transistors present in the circuit, one parallel-coupled transistor present in the circuit, or some parallel-coupled transistors present in the circuit. The switch timing controller 206 receives at least three inputs and sends at least two outputs. Alternatively, the number of inputs received by the switch timing controller 206 and/or the number of outputs sent by the switch timing controller 206 may vary in other examples. The current sensor 302 is coupled to the averager 210 and the transistor 202. Alternatively, the current sensor 302 may be coupled to the averager 210 and the transistor 204. The delay controller 304 is coupled to the averager 210. The delay controller 304 receives a metric representative of at least one transistor in the circuit. The delay controller 304 receives a signal (e.g., PWM signal) from the PWM generator 212. The signal from the PWM generator interacts with a series of devices (e.g., buffers, amplifiers, multiplexors, etc.) to create a new signal which is sent to the gate driver 214 and/or the gate driver 216.

The example current sensor 302 includes electronic components such as resistors, capacitors, inductors, transistors (e.g., FET's, diodes, etc.), amplifiers, buffers, multiplexors, or any electrical component. The current sensor 302 may measure, sense, receive, etc., a current metric from at least one transistor. The current sensor 302 may be implemented with a sensing FET, a current sensing integrated chip (current sensing IC), shunt resistor, current transducer, etc. The current metric that the current sensor 302 generates is a current and/or voltage value representative of the peak input current seen by the transistor 202 and/or the transistor 204.

The example delay controller 304 includes electronic components such as resistors, capacitors, inductors, transistors (e.g., FET's, diodes, etc.), amplifiers, buffers, multiplexors, or any electrical component not directly disclosed herein. The delay controller 304 is coupled to the PWM generator 212 such that the incoming switching signal (e.g., PWM signal) to the transistor 202 and/or transistor 204 may be altered and/or adjusted.

Figure 4:
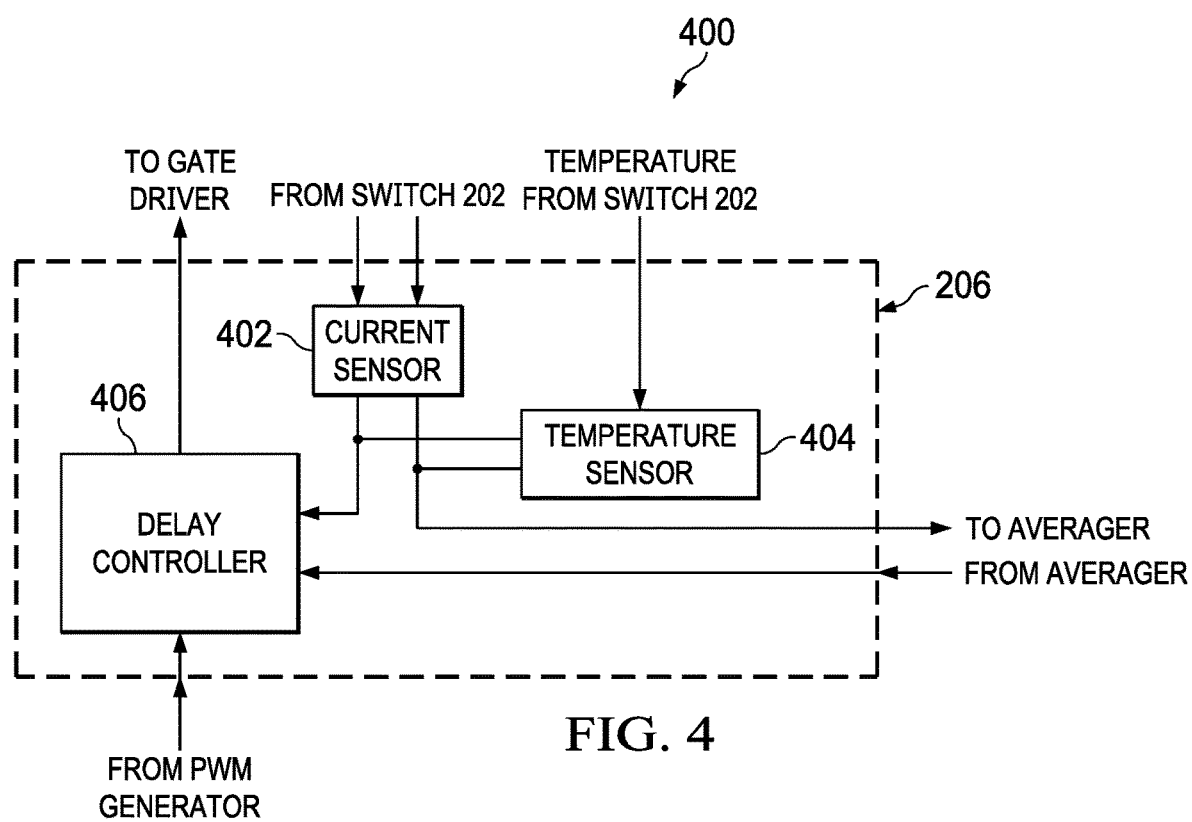
FIG. 4 is a block diagram illustrating additional detail of an example implementation of one of the switch timing controllers of FIG. 2, including temperature sensing capabilities.

FIG. 4 is a block diagram 400 illustrating additional detail of an example implementation of one of the switch timing controllers 206 of FIG. 2, including temperature sensing capabilities. Likewise, the example block diagram for the switch timing controller as shown in FIG. 4 may be used for the switch timing controller 208. More specifically, the switch timing controller may be replicated for each parallel-coupled transistor. In this example, the temperature sensor 404 is coupled to the output of the current sensor 402 to provide peak temperature information from the individual transistor 202. The switch timing controller 206 receives at least three inputs and sends at least two outputs. Alternatively, the number of inputs received by the switch timing controller 206 and/or the number of outputs sent by the switch timing controller 206 may vary in other examples. The current sensor 402 is coupled to the averager 210 and the transistor 202. Alternatively, a second switch timing controller may include a second current sensor, with the second current sensor coupled to the averager 210 and the transistor 204. Additionally, the temperature sensor 404 is coupled to the delay controller 406. The delay controller 406 is coupled to the averager 210. The delay controller 406 receives a metric representative of at least one transistor (e.g., 202 or 204) in the circuit. This metric may be in the form of a current, voltage, and/or temperature. The delay controller 406 receives a signal (e.g., PWM signal) from the PWM generator 212. The signal (e.g., PWM signal) from the PWM generator interacts with a series of devices (e.g., buffers, amplifiers, multiplexors, etc.) to create a new signal which is sent to the gate driver 214 and/or the gate driver 216.

The example current sensor 402 includes electronic components such as resistors, capacitors, inductors, transistors (e.g., FET's, diodes, etc.), amplifiers, buffers, multiplexors, or any electrical component. The current sensor 402 may measure, sense and/or receive, a current metric from at least one transistor. The current metric that the current sensor 402 generates is a current and/or voltage value representative of the peak input current seen by the transistor 202 and/or the transistor 204.

The example temperature sensor 404 is coupled to an internal and/or external temperature sensing circuit. The temperature sensor 404 is coupled to a temperature sensing device, such as a thermistor. The temperature sensor senses the junction temperature of the transistors 202, 204. A pre-determined percentage of the temperature information is coupled to the peak current information from the current sensor 402 (e.g., the predetermined percentage is a temperature value proportional to the actual transistor 202, 204 temperature value). The information from the temperature sensor 404 and the current sensor 402 may then be sent to the delay controller 406. The delay controller 406 adjusts the parameters of the PWM signal to delay the turn on and/or off time of the parallel-coupled transistors (e.g., 202 or 204).

The delay controller 406 includes electronic components such as resistors, capacitors, inductors, transistors (e.g., FET's, diodes, etc.), amplifiers, buffers, multiplexors, or any electrical component. The delay controller 406 uses metrics generated by the current sensor 402 and/or temperature sensor 404 to modify the PWM signal from the PWM generator 212. The delay controller 406 is coupled to the PWM generator 212 such that the incoming switching signal (e.g., PWM signal) to the transistor 202 and/or transistor 204 may be altered or adjusted.

Figure 5:
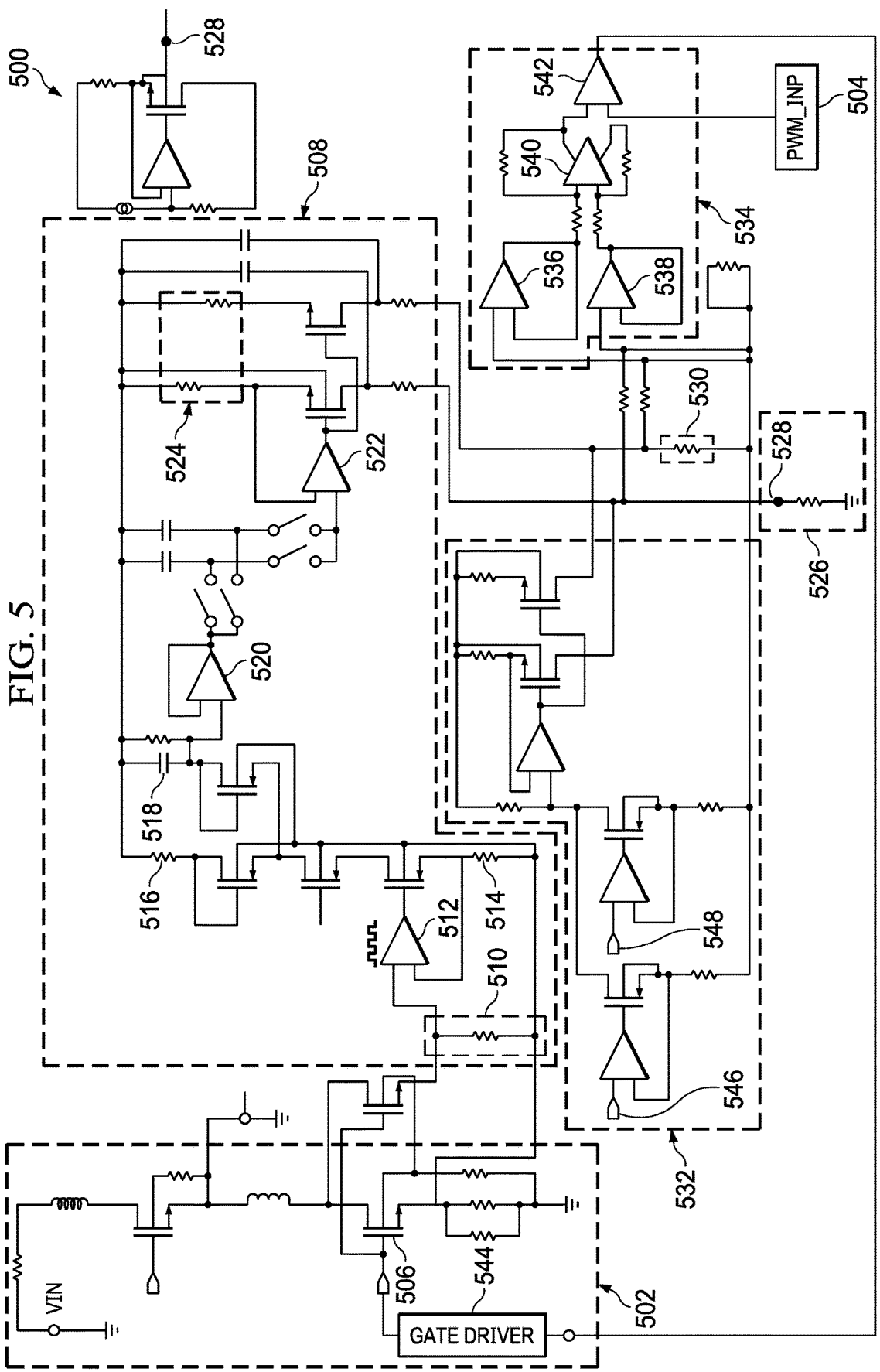
FIG. 5 is a schematic illustrating additional detail of an example implementation of one of the switch timing controllers of FIG. 2.

FIG. 5 is a schematic 500 illustrating additional detail of an example implementation of one of the switch timing controllers (206 or 208) of FIG. 2. In this example implementation, the turn on and/or off time for an example low side transistor 506 is adjusted. Accordingly, FIG. 5 depicts the switch timing controller (e.g., the switch timing controller 206 or 208 of FIG. 2) coupled to an example power conversion circuit 502 and an example averager 526. In this example, the switch timing controller includes the current sensor 508, the temperature sensor 532, and the delay controller 534. In other examples disclosed herein, the order in which the current sensor 508, temperature sensor 532, delay controller 534, averager 526, and power conversion circuit 502 interact may be rearranged. When multiple transistors are coupled in parallel, there will be an additional replica switch timing controller (e.g., the current sensor 508, temperature sensor 532, and delay controller 534) for all parallel-coupled transistors. The averager 526 is coupled to all existing switch timing controllers (e.g., 206 or 208).

The example power conversion circuit 502 may be any circuit used for a power stage. For example, a buck converter utilizes transistors to convert a high DC input voltage to a low DC output voltage. In other examples, the power conversion circuit 502 be adopted into power stages such as automobile applications, personal electronic devices, integrated chips, etc. Additionally, other examples disclosed herein include power conversion circuits for GaN power stages (e.g., a power stage utilizing a GaN transistor).

The example PWM generator 504 generates a PWM signal (e.g., turn on and/or off signal) for the low side transistor 506. Example implementations of the PWM generator 504 include using an integrated circuit such as a timing chip, comparators, etc. Regardless of implementation, the PWM generator 504 is coupled to a switch timing controller (e.g., 206 or 208) for each individual parallel-coupled transistor. The switch timing controllers (e.g., 206 or 208) provide an individual adjusted PWM signal for each parallel-coupled transistor.

The example low-side transistor 506 is a three terminal switching device (e.g., HEMT). Examples disclosed herein include a low-side transistor 506 produced from a Gallium Nitride (GaN) substrate. Examples disclosed herein include a GaN transistor used in power stage applications. Further example power stage applications include power factor correction circuits, discontinuous current mode power switching circuits, continuous current mode power switching circuits, adapters, electric vehicle charging units, etc. Additionally, examples disclosed herein include parallel-coupled GaN transistors. Other examples include a low-side transistor 506 and/or parallel coupled transistors produced using another substrate such as Silicon (Si), Silicon Carbide (SiC), or any other substrate.

The example current sensor 508 includes a trimmed resistor 510. The trimmed resistor 510 aids in the measurement of current by creating a voltage drop. The voltage drop created is proportional to the peak current seen by the low-side transistor 506. For example, when a peak current from the low-side transistor 506 travels through the trimmed resistor 510, a voltage drop across the trimmed resistor 510 is created. The peak voltage measured across the voltage drop is proportional to the peak current through the low-side transistor 506. The example current measured via the example trimmed resistor 510 represents the current flowing through the low side transistor 506 in a manner that is proportional in magnitude (e.g., may be degrees of magnitude greater than or less than the actual peak current flowing through the transistor).

The example amplifier 512 is a low offset voltage, high bandwidth amplifier which amplifies the voltage over the trimmed resistor 510. Alternatively, the amplifier 512 may be any device which outputs a value proportional to the input. Due to the amplifier 512, the voltage captured over the trimmed resistor 510 is forced on the resistor 514. The trimmed resistor 510 is coupled with the positive terminal of the amplifier 512 and the resistor 514 is coupled with the negative terminal of the amplifier 512. In other examples, the trimmed resistor 510 may be coupled to the negative terminal of the amplifier 512 and/or the resistor 514 may be coupled to the positive terminal of the amplifier 512.

The example resistor 514 is coupled to an amplification resistor 516. The voltage over the resistor 514 may be increased and/or decreased across a voltage drop over the amplification resistor 516. The amplification resistor 516 is coupled to the example voltage capturing capacitor 518. For example, the peak current flowing through the trimmed resistor 510 is transferred as a peak voltage over the resistor 514 due to a voltage drop. The amplification resistor 516 creates a proportional peak voltage to be captured by the voltage capturing capacitor 518.

The example voltage capturing capacitor 518 is coupled to a series of example voltage buffers 520, 522. In other examples, there may be only one voltage buffer 520 or 522 coupled to the voltage capturing capacitor 518, or there may be more than one voltage buffers 520, 522 coupled to the voltage capturing capacitor 518.

The example voltage buffers 520, 522 ensure the peak voltage value from the voltage capturing capacitor 518 is transferred across the capturing trimmed resistors 524. Furthermore, the capturing trimmed resistors 524 are coupled to a parallel feedback pin 528 and an additional averaging trimmed resistor 530. In some examples disclosed herein, the averaging trimmed resistor 530 includes a resistance equal to the capturing trimmed resistors 524. Likewise, the parallel feedback pin 528 includes resistors which are equivalent in resistance to the resistance of the averaging trimmed resistor 530. The parallel feedback pin 528 is implemented on an external circuit. Other examples disclosed herein include a parallel feedback pin 528 implemented on the same circuit and/or die as the switch timing controller (e.g., the switch timing controller 206 or 208 of FIG. 2). The parallel feedback pin 528 is coupled with the averager 526. An equivalent number of trimmed resistors for the total number of parallel coupled transistors is coupled to the parallel feedback pin 528. For example, for three transistors coupled in parallel, there may be three resistors coupled to the same external parallel feedback pin 528. Alternatively, there may be a single resistor coupled to the parallel feedback pin 528, the single resistor having a resistance equivalent to the parallel resistance value of all existing parallel-coupled transistors.

The averager 526 may include a set of parallel-coupled resistances in which the averager 526 generates a metric over the set of parallel-coupled resistances. In this example, the averager is implemented on an external circuit, coupled to at least one switch timing controller. Alternatively, the averager 526 may be implemented internally on the same circuit and/or die as the switch timing controller (e.g., the switch timing controller 206 or 208 of FIG. 2). In other examples, the averager 526 may receive a single transistor initial peak current, the single transistor deemed the master transistor. In this scenario, the output of the averager 526 is the initial peak current of the master transistor. In the master transistor case, the turn on and/or off times of the parallel-coupled are adjusted until their initial peak currents match the master transistor peak current.

The example temperature sensor 532 is coupled to the output of the current sensor 508. The temperature sensing network 532 includes a sensing resistor (e.g., a thermistor), which obtains the temperature value of the low side transistor 506. The temperature sensing network 532 receives at least two voltage values, a bandgap temperature voltage 546, and a temperature voltage 548. The bandgap temperature voltage is a reference voltage independent of temperature. The bandgap temperature voltage 546 may range from 0 to 1.25V; however, the bandgap temperature voltage 546 is not limited to the above range. The temperature voltage 548 is dependent on the thermistor temperature. The temperature voltage 548 may also range from 0 to 1.2V; however, the temperature voltage is not limited to the above defined range. The thermistor includes a variable resistor in which the resistance changes in response to changes in temperature. For example, there will be a constant current forced through the thermistor. When the transistor heats up, the voltage over the resistor changes, therefore allowing for the temperature value to be measured. This value is then sent through a series of buffers and amplifiers to send a percentage of the transistor temperature value to the current sensor 508 output and the averager 526. Alternatively, the value sent to the delay controller 534 may be a weighted average of each individual transistor peak current plus a percentage of the individual transistor temperature information.

The example delay controller 534 is coupled to the averager 526, the temperature sensor 532, and the current sensor 508. The peak current and peak temperature values of the individual low side transistor 506 are received in the form of a voltage at the delay controller 534. Alternatively, the peak current and peak temperature vales of the individual low side transistor 506 may be received in the form of a current, temperature, voltage, etc., at the delay controller 534. Additionally, the average peak current and/or junction temperature values obtained from the averager 526 is sent to the delay controller 534.

The delay controller 534 includes buffers 536, 538, a difference amplifier 540, and a delay generator 542. There may exist a series of buffers in place of the buffers 536, 538.

In the example disclosed in FIG. 5, the positive input of the difference amplifier 540 is coupled to the output of the buffer 536. Additionally, the negative input of the difference amplifier 540 is coupled to output of the buffer 538. In other examples disclosed herein, the negative input of the difference amplifier 540 may be coupled to the output of the buffer 536. Likewise, the positive input of the difference amplifier 540 may be coupled to the output of the buffer 538. The difference amplifier 540 generates a signal based on a comparison between the individual transistor peak current and the average transistor peak current. In other examples disclosed herein, the difference amplifier 540 may generate a signal based on a comparison between the individual transistor temperature value and the average transistor temperature value.

The example delay generator 542 is coupled to the pulse width modulation generator 504 (PWM Generator 504) and the output of the difference amplifier 540. The delay generator 542 may receive a current, voltage and/or temperature value from the difference amplifier 540. The delay generator 542 applies a delay (e.g., a shift in timing and/or frequency) to the signal from the PWM generator 504. The delay generator 542 may utilize the information received from the difference amplifier 540 and the PWM generator 504 to adjust the turn on and/or off times of the parallel-coupled transistors using an adjustment loop (e.g., servomechanism loop, etc.). The delay generator 542 sends information received from the difference amplifier 540 through an example servomechanism loop. A servomechanism loop, for example, uses error sensing feedback to control operations of the parallel-coupled transistors. The servomechanism loop generates a second signal which is an adjusted variant of the pulse width modulated signal. Additionally, there may be additional servomechanism loops for each individual transistor. Alternatively, the delay generator 542 may modify the signal from the PWM generator 504 in any way not directly disclosed herein. The output of the delay generator 542 is coupled to the gate driver 544.

While an example manner of implementing the switch timing controller of FIG. 1 is illustrated in FIGS. 2-5, one or more of the elements, processes and/or devices illustrated in FIGS. 2-5 may be combined, divided, re-arranged, omitted, eliminated and/or implemented in any other way. Further, the example current sensor (136, 138, 140, 142, 302, 402, or 508), the example temperature sensor (404 or 532), the example delay controller (304, 406, or 534), the example averager (210 or 526), the example PWM generator (122, 212, or 504), the example delay generator (542), the example delay circuit (172, 174, 176, 178) and/or, more generally, the example switch timing controller of FIGS. 1-5 may be implemented by hardware, software, firmware and/or any combination of hardware, software and/or firmware. Thus, for example, any of the example current sensor (136, 138, 140, 142, 302, 402, or 508), the example temperature sensor (404 or 532), the example delay controller (304, 406, or 534), the example averager (210 or 526), the example PWM generator (122, 212, or 504), the example delay generator (542), the example delay circuit (172, 174, 176, 178) and/or, more generally, the example switch timing controller of FIGS. 1-5 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC (s)), programmable logic device(s) (PLD(s)) and/or field programmable logic device(s) (FPLD(s)). When reading any of the apparatus or system claims of this patent to cover a purely software and/or firmware implementation, at least one of the example current sensor (136, 138, 140, 142, 302, 402, or 508), the example temperature sensor (404 or 532), the example delay controller (304, 406, or 534), the example averager (210 or 526), the example PWM generator (122, 212, or 504), the example delay generator (542), the example delay circuit (172, 174, 176, 178) and/or, more generally, the example switch timing controller of FIGS. 1-5 is/are hereby expressly defined to include a non-transitory computer readable storage device or storage disk such as a memory, a digital versatile disk (DVD), a compact disk (CD), a Blu-ray disk, etc. including the software and/or firmware. Further still, the example switch timing controller of FIGS. 1-5 may include one or more elements, processes and/or devices in addition to, or instead of, those illustrated in FIGS. 1-5, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

A flowchart representative of example hardware logic, machine readable instructions, hardware implemented state machines, and/or any combination thereof for implementing the switch timing controller of FIG. 1 is shown in FIGS. 2-5. The machine readable instructions may be an executable program or portion of an executable program for execution by a computer processor such as the processor 912 shown in the example processor platform 900 discussed below in connection with FIG. 9. The program may be embodied in software stored on a non-transitory computer readable storage medium such as a CD-ROM, a floppy disk, a hard drive, a DVD, a Blu-ray disk, or a memory associated with the processor 912, but the entire program and/or parts thereof could alternatively be executed by a device other than the processor 912 and/or embodied in firmware or dedicated hardware. Further, although the example program is described with reference to the flowchart illustrated in FIG. 6, many other methods of implementing the example switch timing controller may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

As mentioned above, the example processes of FIG. 6 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

Figure 6:
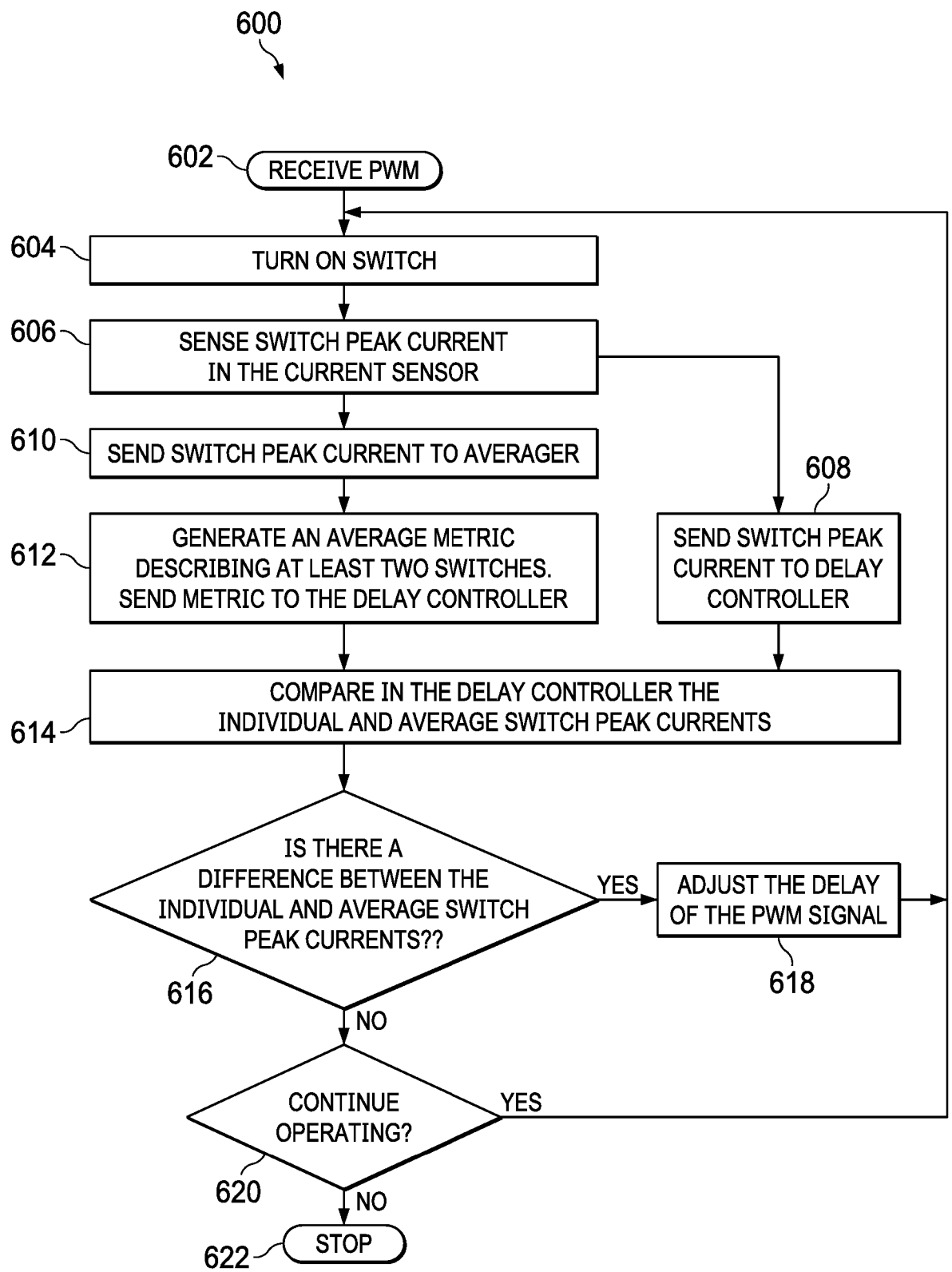
FIG. 6 is a flowchart representative of example machine readable instructions that may be executed to implement the example switch timing controller of FIGS. 1-5.

FIG. 6 is a flowchart 600 representative of example machine readable instructions that may be executed to implement the example switch timing controller (206 or 208) of FIGS. 1-5. Examples disclosed herein include the gate driver 544 receiving a PWM signal from the delay generator 542 (Block 602). Once the PWM signal is received, the gate driver 544 sends the turn on and/or off signal to the low side transistor 506 (Block 604). The low side transistor 506 may experience a peak current as it is initially switched on (e.g., conducting). The peak current value generated through the low side transistor 506 is then sent to the switch timing controller (Block 606). Encompassed within the switch timing controller (FIG. 2 206) is the current sensor 508. The current sensor senses the peak current through the low side transistor 506 and replicate it (Block 606). The peak current is replicated at least twice, a first time to be sent to the delay controller 534 (Block 608) and second time to be sent to the averager 526 (Block 610).

The averager 526 computes a metric representative of at least two transistors (Block 612). The two transistors are parallel-coupled transistors. The metric generated may be a direct average, an estimated average, or any other metric describing the peak current through a transistor not directly disclosed herein. Once the metric is created, the averager 526 sends the newly created and/or generated metric to the delay controller 534 via a conducting path such as copper bus (Block 612).

The delay controller 534 receives a metric representative of the low side transistor 506 and a metric representative of all parallel-coupled transistors. The delay controller 534 compares, via a series of buffers 536, 538 and the differential amplifier 540, the metric representative individual low side transistor 506 peak current value with the metric representative of all parallel transistors (Block 614). The output of the differential amplifier 540 is a metric proportional to the difference between the individual low side transistor 506 peak current with the peak current metric representative of at least two transistors coupled in parallel. In other examples, the difference amplifier 540 may be replaced with any network capable of creating a metric which is proportional to at least two input signals (e.g., summing amplifier).

The differential amplifier 540 generates an indication to be sent to the delay generator 542 if there is a difference between the metric representative individual low side transistor 506 peak current value with the metric representative of all parallel transistors (Block 616). For example, the delay generator 542 will delay the PWM signal (e.g., signal from the PWM generator 504) in response to an indication from the differential amplifier 540 (Block 618).

Another example includes the delay generator 542 creating a delay in the rising edge of the PWM signal. Accordingly, the delay created by the delay generator 542 may be performed using a processor, microcontroller, discrete components, using an adjustment loop (e.g., a servomechanism loop) etc.

If the process is to cease operating (Block 620), the process will stop (Block 622). Examples when the process is to cease operating include loss of power, user shutoff, automatic shutoff, etc.

FIG. 7A is a graphical illustration 702 of example initial peak currents through the parallel-coupled transistors of FIGS. 1-2, and 5 versus time without the use of a switch timing controller, as described herein. The example figure FIG. 7A, illustration 702, includes two waveforms 704, 706 corresponding to the current through two parallel-coupled transistors (e.g., 202 and 204). The current through the example transistor 202 corresponds to the waveform 704 and the current through the example transistor 204 corresponds to the waveform 706.

It is known that because of device characteristic differences, one of the transistors may turn on slightly faster than the other parallel-coupled transistor. In this example 702, the transistor 202 turns on faster than the transistor 204. Clearly depicted in FIG. 7A, transistor 202 with current waveform 704 experiences a much higher initial peak current than transistor 204 with current waveform 706 without any delay compensation.

FIG. 7B is a graphical illustration 708 of example initial peak currents through the parallel-coupled transistors of FIGS. 1-2, and 5 versus time with the use of the example switch timing controller, as described herein. The example figure FIG. 7B, illustration 708, includes two waveforms 710, 712 corresponding to the current through two parallel-coupled transistors (e.g., 202 and 204). The current through the example transistor 202 corresponds to the waveform 710 and the current through the example transistor 204 corresponds to the waveform 712. It is known that because of device characteristic differences, one of the transistors may turn on slightly faster than the other parallel-coupled transistor. As disclosed herein, by adjusting the turn on and/or off time of each transistor (e.g., 202 or 204) dependent on the individual transistor peak current, a delay can be applied to the transistor PWM signal, effectively synchronizing each transistor. In this example 702, the transistor 202 turns on at relatively the same time as transistor 204. Clearly depicted in FIG. 7B, transistor 202 with current waveform 710 experiences similar initial peak current as transistor 204 with current waveform 712 with the addition of delay compensation.

FIG. 8 is a graphical illustration 800 of varying data sets illustrating example initial peak currents through the parallel-coupled transistors of FIGS. 1-2 and 5 with and without the use of the example switch timing controller of FIGS. 1-5. The vertical axis is representational of difference (e.g., maximum difference) in peak current after delay compensation has been applied in amperes. The horizontal axis is representational of difference (e.g., maximum difference) in peak currents before delay compensation has been applied. Each data point includes an associated data point, one corresponding to the absence (before) of delay compensation and the other corresponding to the inclusion (after) of delay compensation. Each data point corresponds to statistically varying process conditions used to build the devices. For example, the example data point 804 hovering around 15 amperes (802), has a difference (e.g., maximum difference) in peak current before delay compensation value of around 15 amperes (with respect to the horizontal axis) and a difference (e.g., maximum difference) in peak current after delay compensation of around 2.5 amperes (with respect to the vertical axis). The example data set in which data point 806 is a part of depicts the difference (e.g., maximum difference) in peak current when no delay compensation is applied (e.g., the after-compensation values are equal to the before compensation values). FIG. 8 depicts the significance of improvement in the difference in peak current before and after delay compensation.

Figure 9:
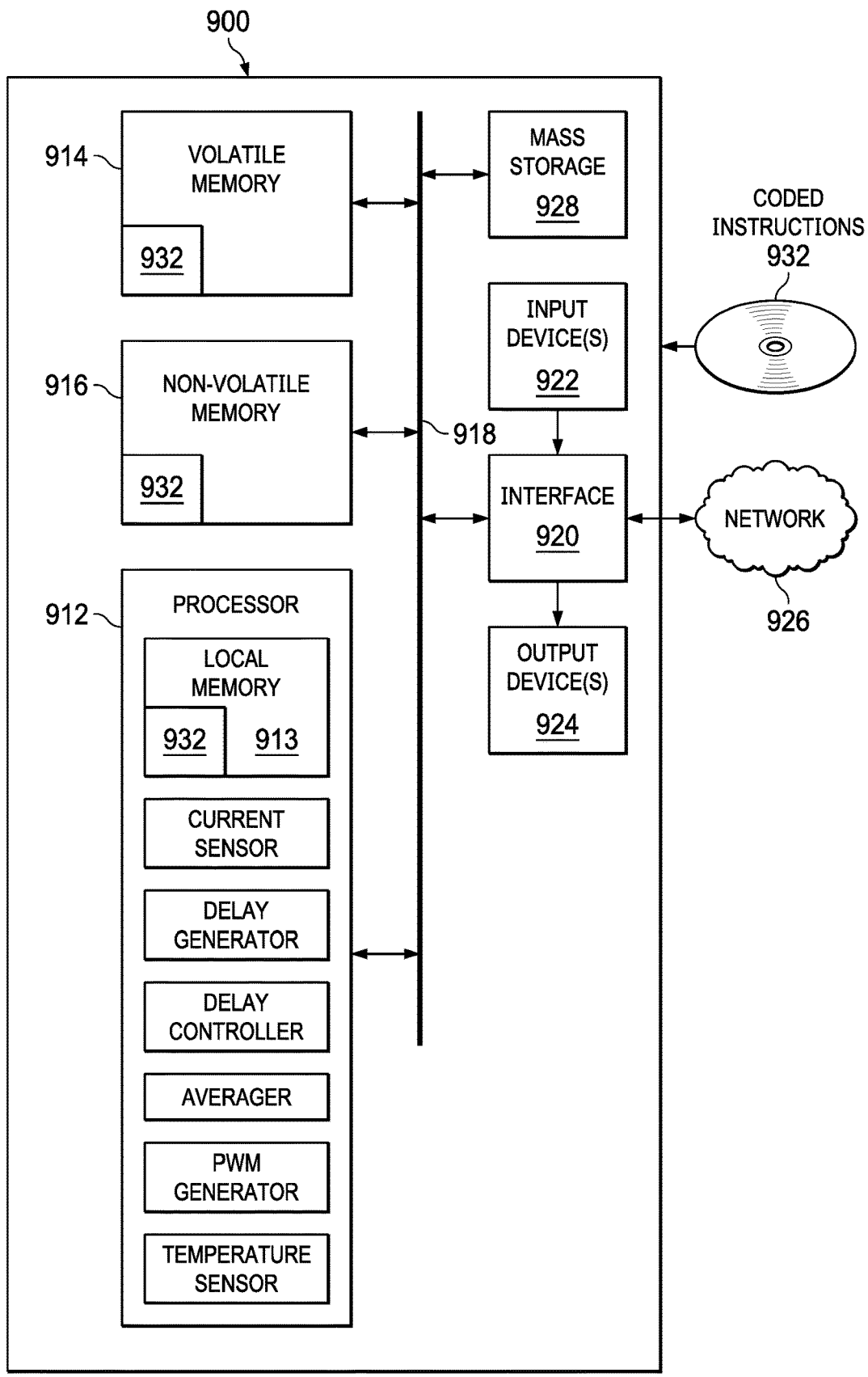
FIG. 9 is a block diagram of an example processing platform structured to execute the machine readable instructions represented in FIG. 6 to implement the switch timing controller of FIGS. 1-5.

FIG. 9 is a block diagram of an example processing platform 900 structured to execute the machine readable instructions represented in FIG. 6 to implement the switch timing controller of FIGS. 1-5. The processor platform 900 can be, for example, an automobile electronic system, an industrial manufacturing device, a server, a personal computer, a workstation, a self-learning machine (e.g., a neural network), a mobile device (e.g., a cell phone, a smart phone, a tablet), a personal digital assistant (PDA), an Internet appliance, or a controller.

The processor platform 900 of the illustrated example includes a processor 912. The processor 912 of the illustrated example is hardware. For example, the processor 912 can be implemented by one or more integrated circuits, logic circuits, microprocessors, GPUs, DSPs, or controllers from any desired family or manufacturer. The hardware processor may be a semiconductor based (e.g., silicon based) device. In this example, the processor implements the example current sensor, the example temperature sensor, the example delay controller, the example averager, the example PWM generator, the example delay generator.

The processor 912 of the illustrated example includes a local memory 913 (e.g., a cache). The processor 912 of the illustrated example is in communication with a main memory including a volatile memory 914 and a non-volatile memory 916 via a bus 918. The volatile memory 914 may be implemented by Synchronous Dynamic Random Access Memory (SDRAM), Dynamic Random Access Memory (DRAM), and/or any other type of random access memory device. The non-volatile memory 916 may be implemented by flash memory and/or any other desired type of memory device. Access to the main memory 914, 916 is controlled by a memory controller.

The processor platform 900 of the illustrated example also includes an interface circuit 920. The interface circuit 920 may be implemented by any type of interface standard, such as an Ethernet interface, a universal serial bus (USB), a near field communication (NFC) interface, and/or a PCI express interface.

In the illustrated example, one or more input devices 922 are connected to the interface circuit 920. The input device(s) 922 permit(s) a user to enter data and/or commands into the processor 912. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 924 are also connected to the interface circuit 920 of the illustrated example. The output devices 924 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 920 of the illustrated example, thus, typically includes a graphics driver card, a graphics driver chip and/or a graphics driver processor.

The interface circuit 920 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 926. The communication can be via, for example, an Ethernet connection, a digital subscriber line (DSL) connection, a telephone line connection, a coaxial cable system, a satellite system, a line-of-site wireless system, a cellular telephone system, etc.

The processor platform 900 of the illustrated example also includes one or more mass storage devices 928 for storing software and/or data. Examples of such mass storage devices 928 include floppy disk drives, hard drive disks, compact disk drives, Blu-ray disk drives, redundant array of independent disks (RAID) systems, and digital versatile disk (DVD) drives.

The machine executable instructions 932 of FIG. 6 may be stored in the mass storage device 928, in the volatile memory 914, in the non-volatile memory 916, and/or on a removable non-transitory computer readable storage medium such as a CD or DVD.

From the foregoing, it will be appreciated that example methods, apparatus and articles of manufacture have been disclosed that overcome the limitations encountered when paralleling transistors based on peak current only or peak current and a percentage of junction temperature values. The disclosed methods, apparatus and articles of manufacture improve the efficiency of using a computing device by syncing two parallel-coupled devices to turn on at the same time. Additionally, limitations included in previous solutions, such as temperature sensing, are no longer apparent in the disclosed methods, apparatus and articles of manufacture. Accordingly, the disclosed methods, apparatus, and articles of manufacture overcomes the limitations caused by thermal resistance differences in transistors. The disclosed methods, apparatus and articles of manufacture are accordingly directed to one or more improvement(s) in the functioning of a computer.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A system, comprising:
a switched circuit node;
a first transistor having a first current terminal, a second current terminal and a gate terminal, the second current terminal being coupled to the switched circuit node;
a second transistor having a first current terminal, a second current terminal and a gate terminal, the first current terminal of the second transistor being coupled to the first current terminal of the first transistor and the second current terminal of the second transistor being coupled to the switched circuit node;

a resistor having one terminal coupled to the switched circuit node and having a second terminal; and a switch timing controller having inputs coupled to the first and second current terminals of the first transistor, an input coupled to the second terminal of the resistor, a pulse width modulation input, and a gate output coupled to the gate terminal of the first transistor, the switch timing controller includes a current sensor having the inputs coupled to the first and second current terminals of the first transistor and having two sensor outputs coupled to a delay circuit, one sensor output being coupled to the second terminal of the resistor.

2. The system of claim 1, wherein the switch timing b controller includes the delay circuit coupled between the pulse width modulation input and the gate output.

3. The system of claim 1, wherein the switch timing controller includes a temperature sensor coupled to an output of the current sensor.

4. The system of claim 3, wherein the temperature sensor is coupled to the first transistor.

5. The system of claim 1, wherein the switch timing controller includes an operational amplifier having two inputs coupled to the two sensor outputs and having an output coupled to the gate terminal of the first transistor.

6. The system of claim 5, wherein the switch timing controller includes a delay circuit having an input coupled to the pulse width modulation input, an input coupled to the output of the operational amplifier, and an output coupled to the gate output.

7. The system of claim 1, wherein the switch timing controller is a first switch timing controller and including a second switch timing controller having inputs coupled to the first and second current terminals of the second transistor, an input coupled to the second terminal of the resistor, a pulse width modulation input coupled to the pulse width modulation input of the first switch timing controller, and a gate output coupled to the gate terminal of the second transistor.

8. The system of claim 1, wherein the first transistor is a gallium nitride transistor and the second transistor is a gallium nitride transistor.

9. A system, comprising:
a switched circuit node;
a first transistor having a first current terminal, a second current terminal and a gate terminal, the second current terminal being coupled to the switched circuit node;
a second transistor having a first current terminal, a second current terminal and a gate terminal, the first current terminal of the second transistor being coupled to the first current terminal of the first transistor and the second current terminal of the second transistor being coupled to the switched circuit node;
a resistor having one terminal coupled to the switched circuit node and having a second terminal;
a first switch timing controller having inputs coupled to the first and second current terminals of the first transistor, an input coupled to the second terminal of the resistor, a pulse width modulation input, and a gate output coupled to the gate terminal of the first transistor; and
a second switch timing controller having inputs coupled to the first and second current terminals of the second transistor, an input coupled to the second terminal of the resistor, a pulse width modulation input coupled to the pulse width modulation input of the first switch timing controller, and a gate output coupled to the gate terminal of the second transistor.

10. The system of claim 9, wherein the switch timing controller includes a delay circuit coupled between the pulse width modulation input and the gate output.

11. The system of claim 9, wherein the switch timing controller includes a current sensor having the inputs coupled to the first and second current terminals of the first transistor and having two sensor outputs coupled to the delay circuit, one sensor output being coupled to the second terminal of the resistor.

12. The system of claim 11, wherein the switch timing controller includes a temperature sensor coupled to an output of the current sensor.

13. The system of claim 12, wherein the temperature sensor is coupled to the first transistor.

14. The system of claim 11, wherein the switch timing controller includes an operational amplifier having two inputs coupled to the two sensor outputs and having an output coupled to the gate terminal of the first transistor.

15. The system of claim 14, wherein the switch timing controller includes a delay circuit having an input coupled to the pulse width modulation input, an input coupled to the output of the operational amplifier, and an output coupled to the gate output.

16. The system of claim 9, wherein the first transistor is a gallium nitride transistor and the second transistor is a gallium nitride transistor.

* * * * *